(12) United States Patent
Hashimoto

(10) Patent No.: US 8,110,245 B2
(45) Date of Patent: Feb. 7, 2012

(54) SEMICONDUCTOR DEVICE, MOUNTING SUBSTRATE AND METHOD OF MANUFACTURING MOUNTING SUBSTRATE, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 448 days.

(21) Appl. No.: 11/637,715

(22) Filed: Dec. 13, 2006

(65) Prior Publication Data

US 2007/0087122 A1 Apr. 19, 2007

Related U.S. Application Data

(62) Division of application No. 10/923,874, filed on Aug. 24, 2004, now Pat. No. 7,163,613, which is a division of application No. 09/673,208, filed as application No. PCT/JP00/00894 on Feb. 17, 2000, now Pat. No. 6,798,058.

(30) Foreign Application Priority Data

Feb. 18, 1999 (JP) .................................. 11-039623

(51) Int. Cl.
  *B05D 1/32* (2006.01)
(52) U.S. Cl. ......................................... 427/58; 418/111
(58) Field of Classification Search .................. 438/106, 438/107, 108, 109, 15, 534, 111; 427/58, 427/282, 96.1, 504
  See application file for complete search history.

(56) References Cited

U.S. PATENT DOCUMENTS

| | | | | |
|---|---|---|---|---|
| 4,052,787 A | * | 10/1977 | Shaheen et al. | 29/827 |
| 4,230,538 A | | 10/1980 | Turner | |
| 4,514,266 A | | 4/1985 | Cole et al. | |
| 4,827,328 A | * | 5/1989 | Ozawa et al. | 361/765 |
| 4,944,850 A | | 7/1990 | Dion | |
| 4,959,278 A | * | 9/1990 | Shimauchi et al. | 428/642 |
| 5,108,553 A | * | 4/1992 | Foster et al. | 205/125 |
| 5,176,811 A | | 1/1993 | Keim et al. | |
| 5,372,699 A | | 12/1994 | Rischke et al. | |
| 5,554,885 A | * | 9/1996 | Yamasaki et al. | 257/666 |
| 5,726,075 A | | 3/1998 | Farnworth et al. | |
| 5,949,142 A | | 9/1999 | Otsuka | |
| 6,175,151 B1 | | 1/2001 | Hashimoto | |
| 6,187,652 B1 | * | 2/2001 | Chou et al. | 438/455 |
| 6,313,525 B1 | * | 11/2001 | Sasano | 257/704 |
| 6,316,288 B1 | * | 11/2001 | Hashimoto | 438/118 |
| 6,414,382 B1 | | 7/2002 | Hashimoto | |
| 6,424,030 B2 | * | 7/2002 | Masayuki et al. | 257/685 |
| 6,646,338 B2 | | 11/2003 | Hashimoto | |

(Continued)

FOREIGN PATENT DOCUMENTS

EP 0 810 656 A2 12/1997

(Continued)

*Primary Examiner* — Michael Cleveland
*Assistant Examiner* — Tabassom Tadayyon Eslami
(74) *Attorney, Agent, or Firm* — Oliff & Berridge, PLC

(57) ABSTRACT

There is provided a semiconductor device comprising: a first plating layer formed on one surface of an interconnect pattern; a second plating layer formed within through holes in the interconnect pattern; a semiconductor chip electrically connected to the first plating layer; an anisotropic conductive material provided on the first plating layer; and a conductive material provided on the second plating layer, wherein the first plating layer has appropriate adhesion properties with the anisotropic conductive material, and the second plating layer has appropriate adhesion properties with the conductive material.

6 Claims, 12 Drawing Sheets

U.S. PATENT DOCUMENTS

| | | | |
|---|---|---|---|
| 6,798,058 | B1 | 9/2004 | Hashimoto |
| 7,163,613 | B2 | 1/2007 | Hashimoto |
| 2007/0087122 | A1 | 4/2007 | Hashimoto |

FOREIGN PATENT DOCUMENTS

| | | | |
|---|---|---|---|
| EP | 0 849 983 A1 | | 6/1998 |
| JP | A-60-244094 | | 12/1985 |
| JP | A-01-061986 | | 3/1989 |
| JP | A-64-061986 | | 3/1989 |
| JP | A-02-120093 | | 5/1990 |
| JP | A-02-232393 | | 9/1990 |
| JP | A-8-279571 | | 10/1996 |
| JP | A-09-260536 | | 10/1997 |
| JP | A-09-307050 | | 11/1997 |
| JP | A-10-125817 | | 5/1998 |
| JP | 410163404 | * | 6/1998 |
| JP | A-10-223696 | | 8/1998 |
| JP | A-10-270624 | | 10/1998 |
| JP | A-11-040620 | | 2/1999 |
| JP | 11040620 | * | 12/1999 |
| JP | A-02-232393 | | 12/1999 |
| JP | B2-3952129 | | 5/2007 |
| WO | WO/98/43289 | * | 3/1998 |
| WO | WO98/33212 | | 7/1998 |

* cited by examiner

SEMICONDUCTOR DEVICE, MOUNTING SUBSTRATE AND METHOD OF MANUFACTURING MOUNTING SUBSTRATE, CIRCUIT BOARD, AND ELECTRONIC INSTRUMENT

This is a Division of application Ser. No. 10/923,874 filed Aug. 24, 2004, now U.S. Pat. No. 7,163,613 which in turn is a Division of application Ser. No. 09/673,208 filed Oct. 13, 2000, now U.S. Pat. No. 6,798,058 which in turn is a National Stage of PCT Application No. PCT/JP00/00894 filed Feb. 17, 2000. The disclosures of the prior applications are hereby incorporated by reference herein in their entirety.

BACKGROUND

The present invention relates to a semiconductor device, a mounting substrate and method of manufacturing the mounting substrate, a circuit board, and an electronic instrument.

The present invention solves the above described problem, and has as its objective the provision of a semiconductor device including an interconnect pattern having portions of its surface with different properties, and similarly a mounting substrate and method of manufacture thereof, a circuit board, and an electronic instrument.

SUMMARY

Semiconductor devices such as T-CSP (Tape-Chip Scale/Size Package) are known, which use a substrate on which an interconnect pattern is formed. Commonly, a semiconductor chip is mounted on the substrate, and with the electrodes of the semiconductor chip electrically connected to the interconnect pattern, solder balls are provided. The characteristics required of the surface of the interconnect pattern for connecting the electrodes of the semiconductor chip and the characteristics required for providing the solder balls are different. Although the surface of the interconnect pattern requires locally varying characteristics, conventionally the whole of the surface of the interconnect pattern has been subjected to a single plating operation.

DETAILED DESCRIPTION OF EMBODIMENTS

The present invention is now described in terms of a number of preferred embodiments, with reference to the drawings.

Figure 1:
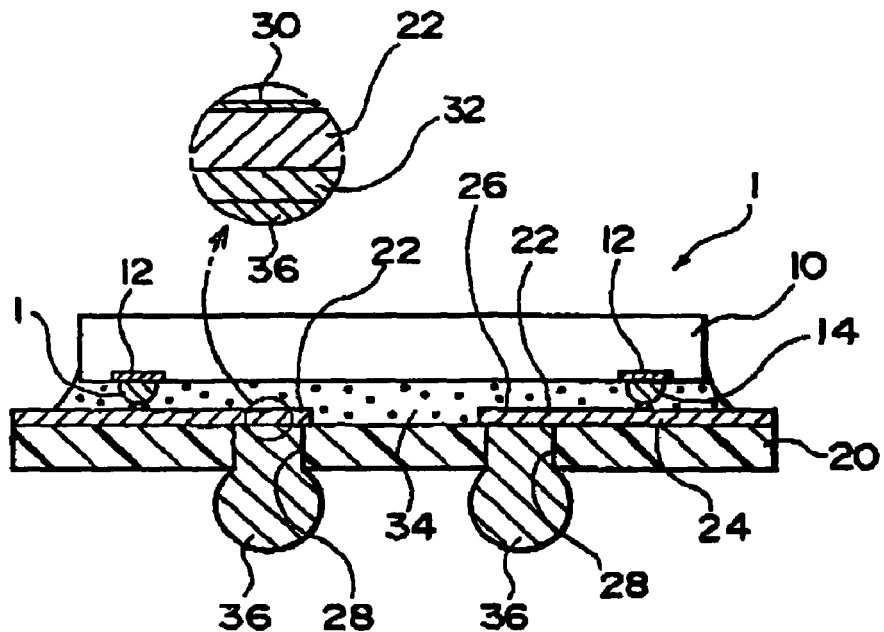
FIG. 1 shows a semiconductor device according to a first embodiment of the present invention.

FIG. 1 shows a first embodiment of the semiconductor device of the present invention. A semiconductor device 1 comprises a semiconductor chip 10 and a substrate 20. When the plan view form of the semiconductor chip 10 is a rectangle (a square or an oblong), along at least one side (which case includes a pair of opposing sides or all four sides), on one surface of the semiconductor chip 10 (the active surface) a plurality of electrodes 12 may be formed. Alternatively, the plurality of electrodes 12 may be arranged in the center of the semiconductor chip 10 or the vicinity thereof. On the electrodes 12 are provided bumps 14 in the form of solder balls, gold wire balls, gold plating, or the like. The electrodes 12 themselves may be in the form of bumps. Between the electrodes 12 and the bumps 14, a layer to prevent the diffusion of the bump metal, of nickel, chromium, titanium, or the like, may be applied.

There is no particular restriction on the overall form of the substrate 20, which may be a rectangle, polygon, or a combination of a plurality of rectangles, and can be a similar figure of the plan view form of the semiconductor chip 10. The thickness of the substrate 20 is commonly determined by the material used, and is not subject to particular restriction. The substrate 20 may be formed of an organic or inorganic material, or may be constituted of a combination thereof. The substrate 20 may be a flexible substrate, or may equally be a rigid substrate. The substrate 20 can be formed by punching out from a flexible substrate in the form of a tape formed of an organic resin.

Figure 2:
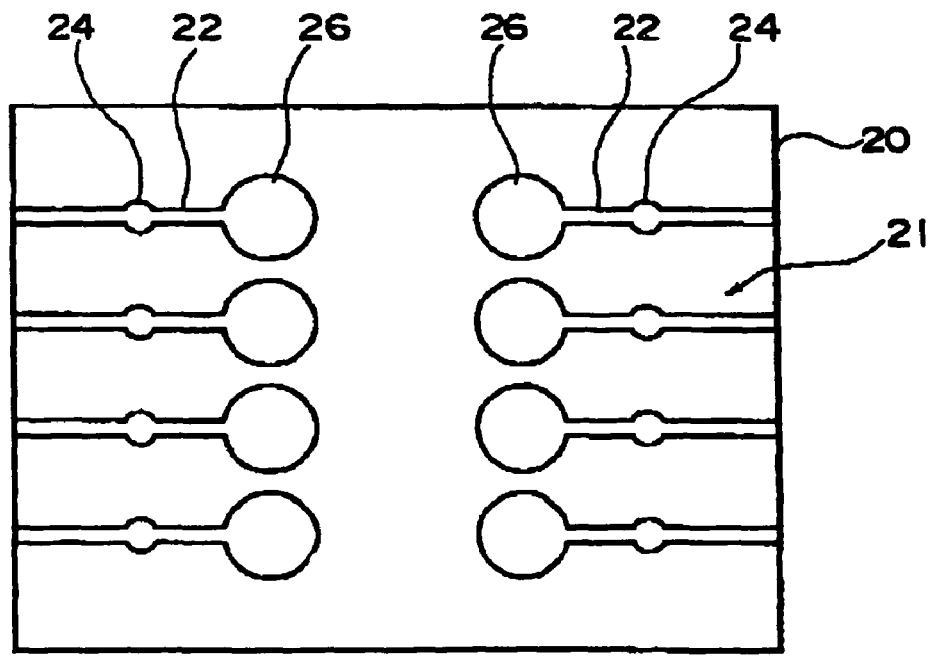
FIG. 2 shows a substrate of a semiconductor device according to the first embodiment of the present invention.

FIG. 2 is a plan view of the substrate of the semiconductor device shown in FIG. 1. As shown in FIGS. 1 and 2, on one surface of the substrate 20 is formed a plurality of interconnects (leads) 22, which constitute an interconnect pattern 21. Each of the interconnects 22 has formed lands 24 and 26. The lands 24 and 26 are commonly formed to be wider than the interconnect 22. The one land 26 may be formed in a position close to the center of the substrate 20, and the other land 24 formed at an intermediate point of the interconnect 22. Of the plurality of interconnects 22, at least one or all is or are not electrically conductive to the other interconnects 22, and is or are electrically isolated. Of the plurality of interconnects 22, interconnects such as those connected in common to the power supply or ground of the semiconductor chip 10 may have the lands 24 and 26 connected together.

In the substrate 20 is formed a plurality of through holes 28. Over each of the through holes 28 passes one of the interconnects 22. The ends of the interconnects 22 may equally be positioned over the through holes 28. When a land 26 is formed at the end of an interconnect 22, the land 26 is positioned over a through hole 28.

As shown in the enlargement in FIG. 1, the interconnects 22 have formed thereon first and second plating layers 30 and 32. The interconnects 22 are formed of copper, or a two-layer construction of platinum and nickel, and the material of the plating layers 30 and 32 can be selected from nickel, palladium, nickel-gold, nickel-palladium-gold, gold, solder, and tin. The first plating layer 30 is formed on the surface of the interconnect 22 opposite to that of the substrate 20. The second plating layer 32 is formed on the surface of the interconnect 22 facing the substrate 20 within the through hole 28. When a land 26 is positioned over the through hole 28, the second plating layer 32 is formed on the land 26. The first and second plating layers 30 and 32 have different properties as a result of differing in at least either of thickness or material.

The first plating layer 30 prevents oxidation at least over the land 24, and ensures conduction, and lowers the electrical contact resistance. Even though the first plating layer 30 is formed, intimate contact with the resin on the interconnects 22 can be obtained. For example, taking as an example of the resin an adhesive of an anisotropic conductive material, when nickel is formed as an underlayer for the plating layer 30, in order that for example a silane coupling material included in the adhesive forms a chemical compound with the nickel or with its oxide or hydroxide, the plating layer 30 is preferably formed to be thin. For example, gold plating of thickness on the order of 0.05 μm can be used for the first plating layer 30. This enables a strong bond to be obtained.

On the other hand, the second plating layer 32 is appropriate for bonding to a conductive material, such as for example external terminals. For example, gold plating of thickness on the order of 0.3 μm as the second plating layer 32 ensures good bonding with the conductive material. If the conductive material is solder, solder plating may be used for the second plating layer 32 to ensure good soldering characteristics. The semiconductor chip 10 is mounted on the substrate 20 by face-down bonding. The bumps 14 of the semiconductor chip 10, and the interconnects 22 formed on the substrate 20 are electrically connected. Since the plating layer 30 is formed on the interconnects 22 a satisfactory electrical connection is obtained. When the lands 24 and 26 are formed on the interconnects 22, the lands 24 and bumps 14 are electrically connected. As a means of the electrical connection may be used an anisotropic conductive material 34 including conductive particles in an adhesive formed of a resin. In this case, the conductive particles are interposed between the interconnects 22 and the bumps 14 to provide electrical conduction. The anisotropic conductive material 34 may be an anisotropic conductive film or anisotropic conductive adhesive.

When the anisotropic conductive material 34 is used, it covers the surface of the interconnects 22 opposite to the surface of contact with the substrate 20, the side surfaces and the end surfaces, or in other words the surfaces not in contact with the substrate 20. When the anisotropic conductive material 34 is not used, a resin of an underfill material or the like is employed to cover the surfaces of the interconnects 22 not in contact with the substrate 20. The material covering the interconnects 22 may also cover the whole of one surface of the substrate 20. Since the first plating layer 30 formed on the interconnects 22 has appropriate adhesion properties with the resin, the resin provided on the interconnects 22 is less liable to peel off. That is to say, the anisotropic conductive material 34 is made less liable to peel off.

On the surface of the interconnects 22 facing the substrate 20, within the through holes 28 a conductive material 36 is provided. In more detail, the conductive material 36 is formed on the second plating layer 32, and projects from the through holes 28. The conductive material 36 forms external terminals. Since the second plating layer 32 has appropriate adhesion properties with the conductive material, a satisfactory electrical connection can be obtained between the conductive material 36 and the second plating layer 32. The conductive material 36 commonly consists of solder balls, but may equally be plating, or conductive projections of for example conductive resin.

Instead of the external terminals being formed by the conductive material 36, the through holes 28 may be filled with the conductive material 36, the second interconnects electrically connected to the conductive material 36 may be formed on the other surface of the substrate 20, and these second interconnects may be provided with external terminals. In this case, since the substrate 20 has interconnects formed on both surfaces it is a double-sided substrate. Furthermore, as the substrate 20 may equally be used a multi-layer substrate or a built-up substrate. When a built-up substrate or multi-layer substrate is used, if an interconnect pattern is formed on a solid ground layer which extends in plan view, then since a micro-strip construction with no surplus interconnect pattern is obtained, the signal transmission characteristics can be improved.

The above description applies to face-down bonding using the anisotropic conductive material 34, but there is no restriction to this method of face-down bonding, and the present invention can be applied to the method of applying heat (and if necessary, pressure) to a semiconductor chip with solder bumps, the method of applying heat and pressure (and if necessary ultrasound bonding) to a semiconductor chip with gold bumps, or the face-down bonding method using the setting shrinking force of a resin. This applies also to the following embodiments.

In FIG. 1 is shown a fan-in type of semiconductor device in which the conductive material 36 forming the external terminals is provided only within the mounting region of the semiconductor chip 10, but this is not limitative of the invention. For example, the present invention can be applied to a fan-out type of semiconductor device in which external terminals are provided only outside the mounting region of the semiconductor chip 10, or a fan-in/fan-out type of semiconductor device in which this is combined with a fan-in type. In a fan-out type or fan-in/fan-out type of semiconductor device, by means of the resin provided on the interconnects 22, a stiffener may be adhered to the outside of the semiconductor chip. This applies also to the following embodiments.

Figure 3:
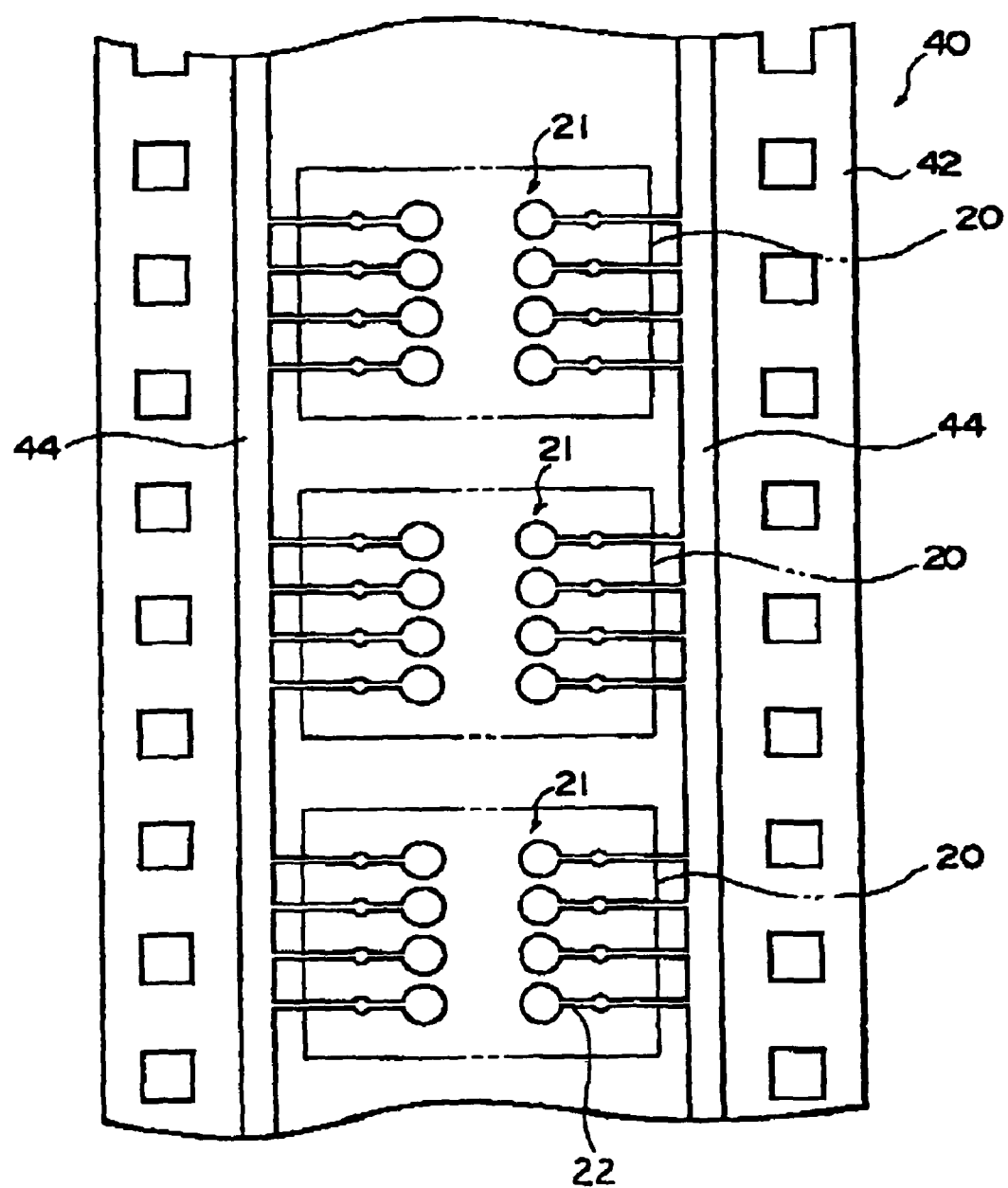
FIG. 3 shows a mounting substrate used in the first embodiment of the present invention.

FIG. 3 shows a mounting substrate of the first embodiment of the present invention. A mounting substrate 40 shown in FIG. 3 is a tape carrier, and has formed a plurality of interconnect patterns 21 (see FIG. 1) for a plurality of semiconductor devices. Each of the interconnect patterns 21 has formed first and second plating layers 30 and 32 (see FIG. 1). The tape carrier formed by the mounting substrate 40 is punched out to obtain mounting substrates corresponding to individual semiconductor devices. A substrate having at least one interconnect pattern 21 formed is a mounting substrate, and the substrate 20 with the interconnect pattern 21 shown in FIG. 1 formed is also a mounting substrate. Alternatively, as a finished product a mounting substrate larger than the outline of the semiconductor device may be provided. In this case, before the semiconductor chip is mounted, on a part and preferably at least half of the outline position of the semiconductor device, one or preferably a plurality of holes (for example slots) can be formed, and the remainder of the outline position (for example the portions between the plurality of holes) may be punched out after mounting the semiconductor chip.

The mounting substrate 40 shown in FIG. 3 includes a substrate 42 in which is formed a plurality of through holes 28 (see FIG. 1), a plurality of interconnect patterns 21 formed on the substrate 42, first and second plating layers 30 and 32 formed on the interconnects 22 constituting the interconnect pattern 21, and at least one plating lead 44. Portions indicated by the same reference numerals as in FIG. 1 are as described above, and further description is omitted here. The construction of a typical tape carrier can be applied to the mounting substrate 40.

The plating lead 44 is formed in a position outside the punching-out position, that is, the outline position of the substrate 20 of the completed semiconductor device. Therefore, when the mounting substrate 40 is punched out, the plating lead 44 can be removed. The interconnects 22 are electrically connected to the plating lead 44. As a result, using the plating lead 44, electroplating can be carried out on the interconnects 22.

Figure 4:
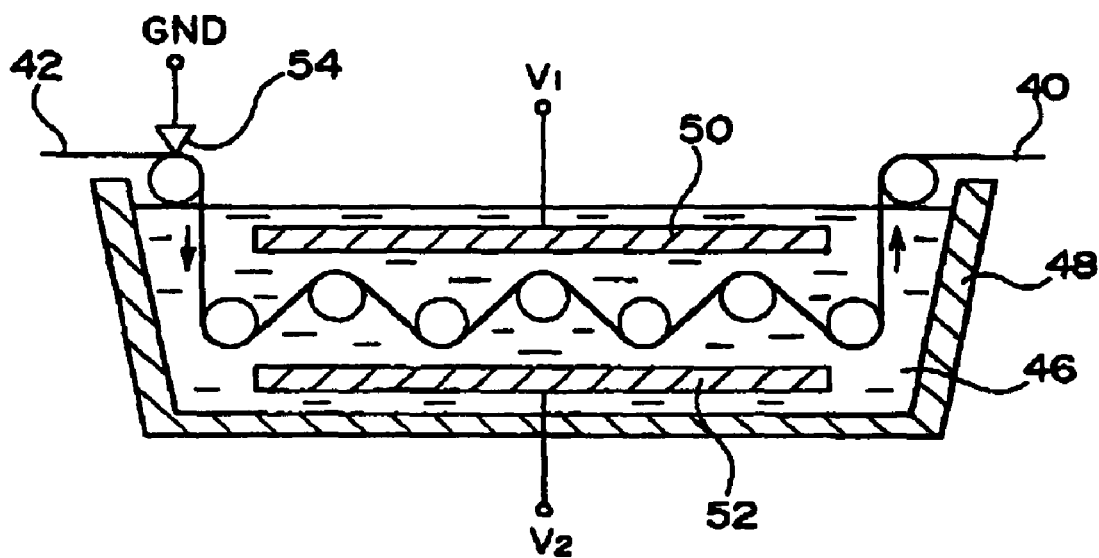
FIG. 4 shows a method of manufacturing a mounting substrate according to the first embodiment of the present invention.

Next, FIG. 4 shows a method of manufacturing this embodiment of the mounting substrate. First, the substrate 42 which constitutes the structure of the mounting substrate 40 from which the first and second plating layers 30 and 32 have been removed is obtained. In this state, on the substrate 42, at least one or a plurality of the interconnect patterns 21 and the plating lead 44 have been formed.

A plating vat 48 is filled with a plating fluid, to provide a plating bath 46. In the plating bath 46 are disposed first and second anodes 50 and 52, and the above described substrate 42 is passed therebetween. In more detail, one surface of the substrate 42 faces the first anode 50, and the other surface faces the second anode 52. It should be noted that if the substrate 42 is a tape, a reel-to-reel process can be applied.

When the plating lead 44 formed on the substrate 42 is connected to a cathode 54 to which a potential lower than that of the anodes 50 and 52 is applied, for example, a ground potential, then currents flow between the plating lead 44 and interconnect pattern 21 (interconnects 22) connected thereto, and each of the first and second anodes 50 and 52. In this way, electroplating is applied to the surface of the interconnect pattern 21 (interconnects 22) opposite to the substrate 42, and to the portions exposed by the through holes 28, and thus the first and second plating layers 30 and 32 can be formed.

By for example applying different voltages V1 and V2 to each of the first and second anodes 50 and 52, the current density of the current flowing from each thereof is arranged to be different. By means of this, the thicknesses of the first and second plating layers 30 and 32 can be made different.

In this way, the first and second plating layers 30 and 32 are formed on the interconnect pattern 21 (interconnects 22), and the mounting substrate 40 is obtained. It should be noted that if the substrate 42 is a tape, the mounting substrate 40 is a tape carrier. Although not shown in the drawings, portions other than those forming electrical contacts may be covered by a permanent resist such as a solder resist, and this applies similarly to the following embodiments. In this case, plating is not applied to the portions other than those forming electrical contacts.

Next, the method of manufacturing a semiconductor device using this embodiment of the mounting substrate is described. On each of the interconnect patterns 21 formed on the above described mounting substrate 40 a semiconductor chip 10 is mounted by face-down bonding. For example, as shown in FIG. 1, the anisotropic conductive material 34 can be used. The anisotropic conductive material 34 may be provided beforehand on the surface of the semiconductor chip 10 on which the electrodes 12 are formed, or may be provided beforehand on the surface of the mounting substrate 40 on which the interconnects 22 are formed. The anisotropic conductive material 34 may be provided to cover each individual interconnect pattern 21 separately, or the anisotropic conductive material 34 may be provided to cover a plurality of interconnect patterns 21.

Figure 5:
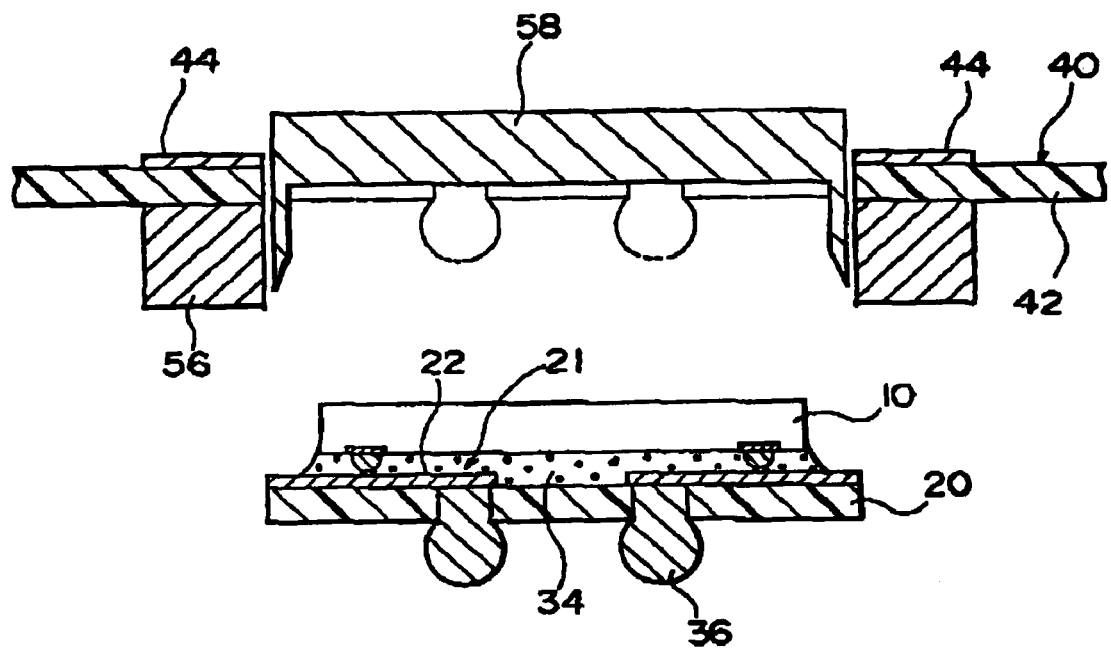
FIG. 5 shows a method of manufacturing a semiconductor device according to the first embodiment of the present invention.

As shown in FIG. 1, the conductive material 36 forming the external terminals is provided. In this way, the plurality of semiconductor chips 10 is mounted on the mounting substrate 40, and a semiconductor device assembly consisting of the result of integrating the plurality of semiconductor devices 1 is obtained. Next, as shown in FIG. 5, the mounting substrate 40 is punched out on the outside of each semiconductor chip 10. The form in which the punching is carried out is not particularly restricted, but may be a shape similar to the plan view form of the semiconductor chip 10. For the punching out, cutting jigs 56 and 58 can be used. In this way, the semiconductor device 1 can be fabricated continuously.

Figure 6:
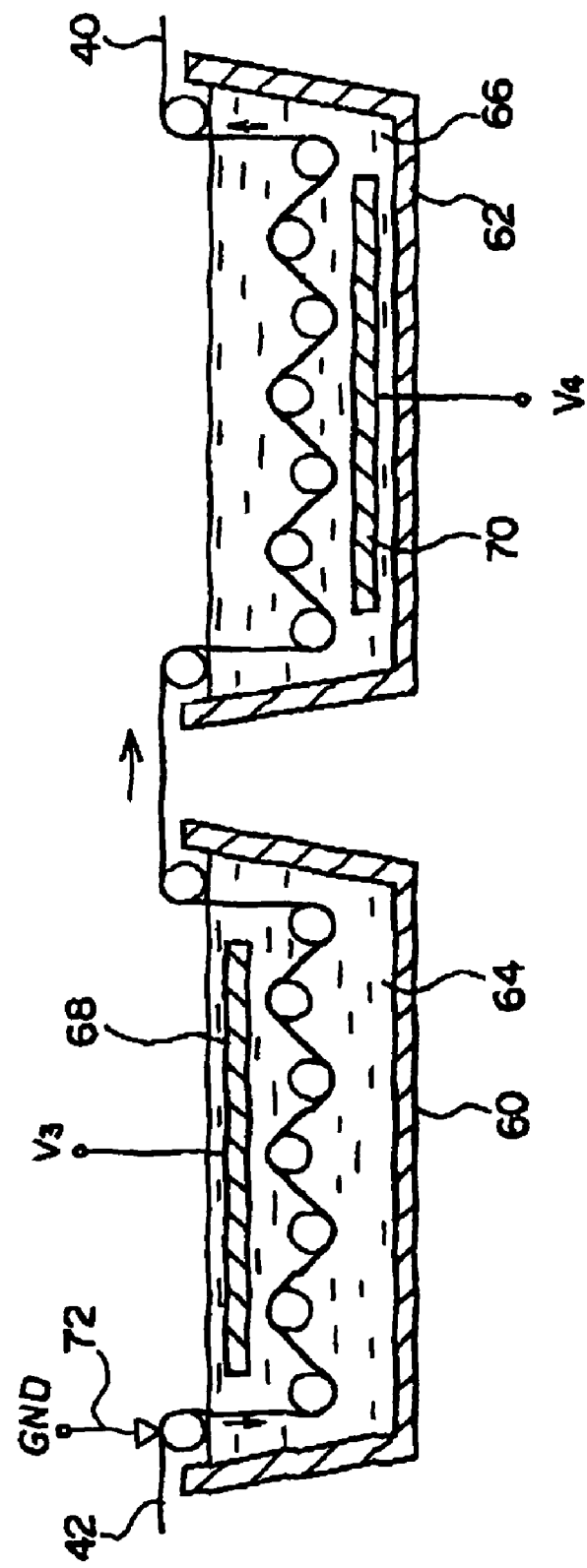
FIG. 6 shows a method of manufacturing a mounting substrate according to a second embodiment of the present invention.

FIG. 6 shows a method of manufacturing a second embodiment of the mounting substrate of the present invention. In this embodiment, the substrate 42 which constitutes the structure of the mounting substrate 40 shown in FIG. 3, from which the first and second plating layers 30 and 32 have been removed is obtained. In this state, on the substrate 42, at least one or a plurality of the interconnect patterns 21 and the plating lead 44 have been formed.

First and second plating vats 60 and 62 are filled with a plating fluid, to provide sequentially first and second plating baths 64 and 66. In the first and second plating baths 64 and 66 are disposed first and second anodes 68 and 70. The substrate 42 is passed through the first plating bath 64 with one surface facing the first anode 68, and next is passed through the second plating bath 66 with the other surface facing the second anode 70. It should be noted that if the substrate 42 is a tape, a reel-to-reel process can be applied.

When the plating lead 44 formed on the substrate 42 is connected to a cathode 72 to which a potential lower than that of the anodes 68 and 70 is applied, for example, a ground potential, then currents flow between the plating lead 44 and interconnect pattern 21 (interconnects 22) connected thereto, and each of the first and second anodes 68 and 70. In this way, electroplating is applied to the surface of the interconnect pattern 21 (interconnects 22) opposite to the substrate 42, and to the portions exposed by the through holes 28, and thus the first and second plating layers 30 and 32 can be formed.

By for example applying different voltages V3 and V4 to each of the first and second anodes 68 and 70, the current density of the current flowing from each thereof is arranged to be different. By means of this, the thicknesses of the first and second plating layers 30 and 32 can be made different.

In this way, the first and second plating layers 30 and 32 are formed on the interconnect pattern 21 (interconnects 22), and the mounting substrate 40 shown in FIG. 3 is obtained. It should be noted that if the substrate 42 is a tape, the mounting substrate 40 is a tape carrier.

It should be noted that in this embodiment, the substrate 42 is consecutively immersed in the first and second plating baths 64 and 66, but this may equally be carried out in separate immersion processes. The first and second plating baths 64 and 66 are not restricted to containing the same metal ions, and may contain different metal ions. In that case, the material of the first and second plating layers 30 and 32 will be different. Furthermore, both the material and the thickness of the first and second plating layers 30 and 32 may be made different.

Figure 7A:
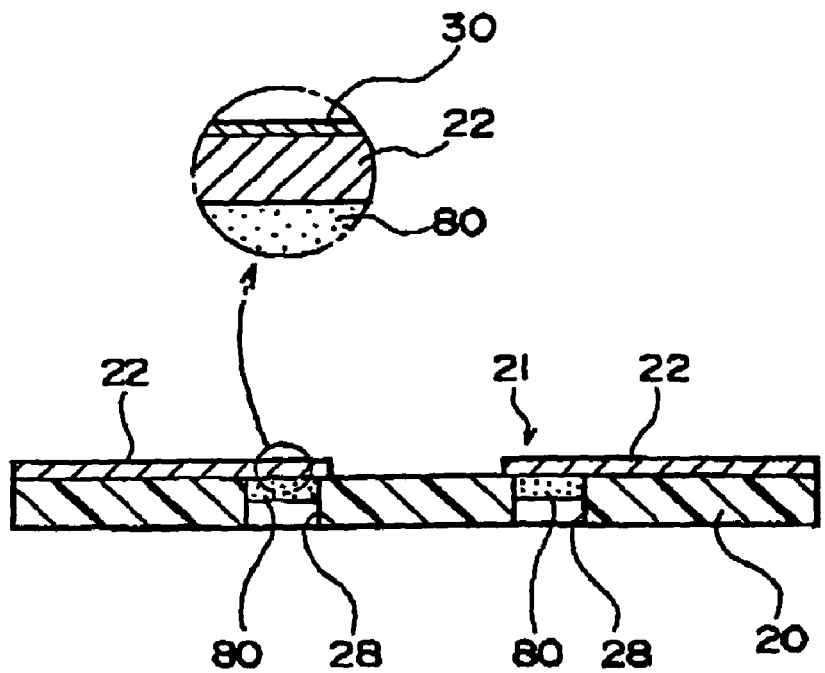
FIGS. 7A and 7B show a method of manufacturing a mounting substrate according to a third embodiment of the present invention.
Figure 7B:
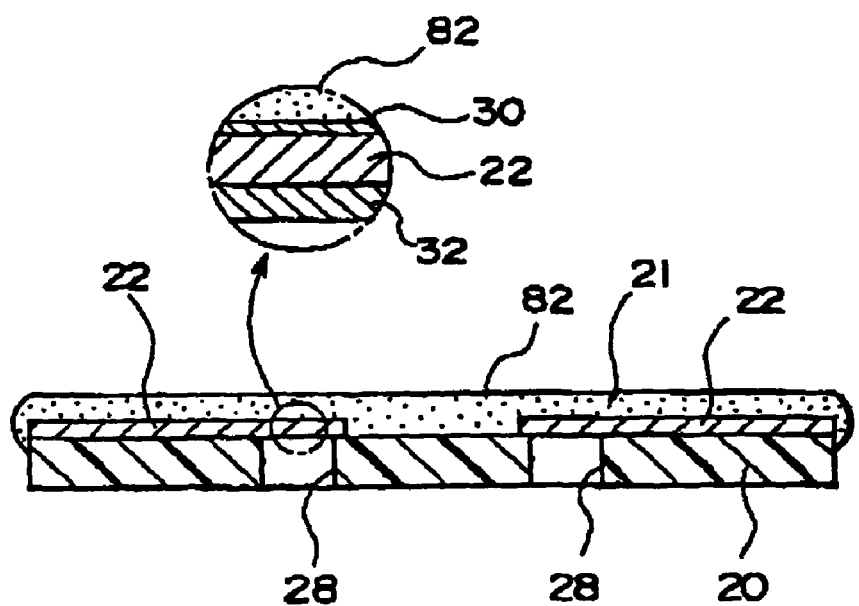

FIGS. 7A and 7B show a method of manufacturing a third embodiment of the mounting substrate of the present invention. In this embodiment, the substrate 20 is obtained with the interconnect pattern 21 (interconnects 22) shown in FIG. 1 formed, but before the plating layers 30 and 32 have been formed.

First, as shown in FIG. 7A, the through holes 28 are filled with a resist 80. The resist 80 may be a resin, or it may be a removable tape or the like. By means of this, the part of the interconnects 22 exposed through the through holes 28 is covered. Then by applying electroless plating the exposed surface of the interconnects 22 is plated. The first plating layer 30 on the surface of the interconnects 22 opposite to that of the substrate 20 is formed. The first plating layer 30 has the properties as described in the first embodiment.

Next, the resist 80 is removed, and as shown in FIG. 7B, the portions of the interconnects 22 not covered by the resist 80 are covered by a resist 82. The resist 82 may be a resin, or may be a removable tape. Above the surface of the interconnects 22 opposite to the substrate 20 is covered by the resist 82, and within the through holes 28, a part of the interconnects 22 is exposed. The first plating layer 30 is covered by the resist 82. Then when the electroless plating is carried out, the exposed surface of the interconnects 22 is plated. On the portion of the interconnects 22 exposed within the through holes 28, the second plating layer 32 is formed. The second plating layer 32 has the properties as described in the first embodiment.

By means of the above process, as shown in FIG. 1, the substrate 20 having the first and second plating layers 30 and 32 formed on the interconnects 22 is obtained, and this forms the mounting substrate. In this embodiment, the order of forming the first and second plating layers 30 and 32 is not significant. In the electroless plating step, the same material may be used for the solution and first and second plating layers 30 and 32 formed with different thicknesses, or different materials may be used for the solution and first and second plating layers 30 and 32 formed of different materials. Further, both the material and thickness of the first and second plating layers 30 and 32 may be made different.

When at least the thicknesses of the first and second plating layers 30 and 32 are being varied, a double-sided plating layer may first be formed without applying a resist, then the resist applied to the layer opposite to the layer to be made thicker, and then further plating applied only to the layer to be made thicker, after which the resist is removed.

Figure 8:
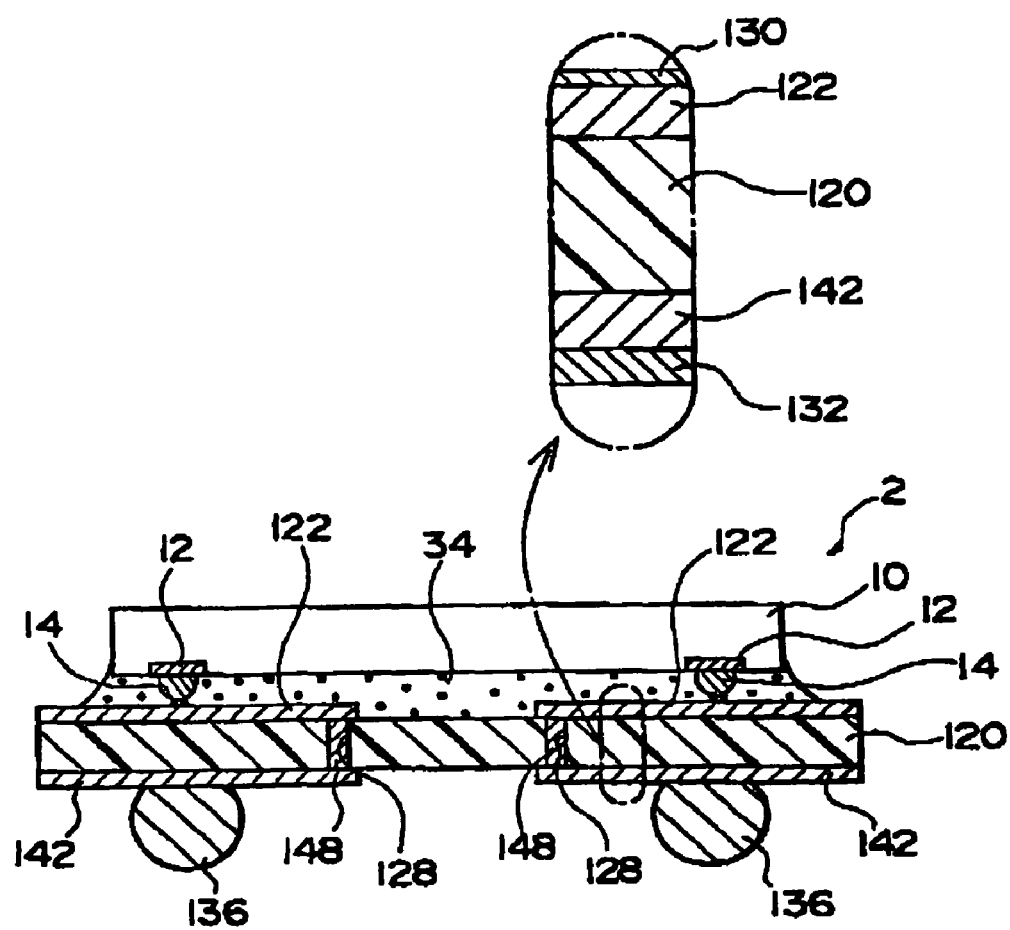
FIG. 8 shows a semiconductor device according to a fourth embodiment of the present invention.

FIG. 8 shows a fourth embodiment of the semiconductor device of the present invention. A semiconductor device 2 comprises a semiconductor chip 10 and a substrate 120. The semiconductor chip 10 is that described in the first embodiment, and has electrodes 12 and bumps 14. In the substrate 120 is formed a plurality of through holes 128, and in form, thickness, and substance these are the same as the substrate 20.

Figure 9A:
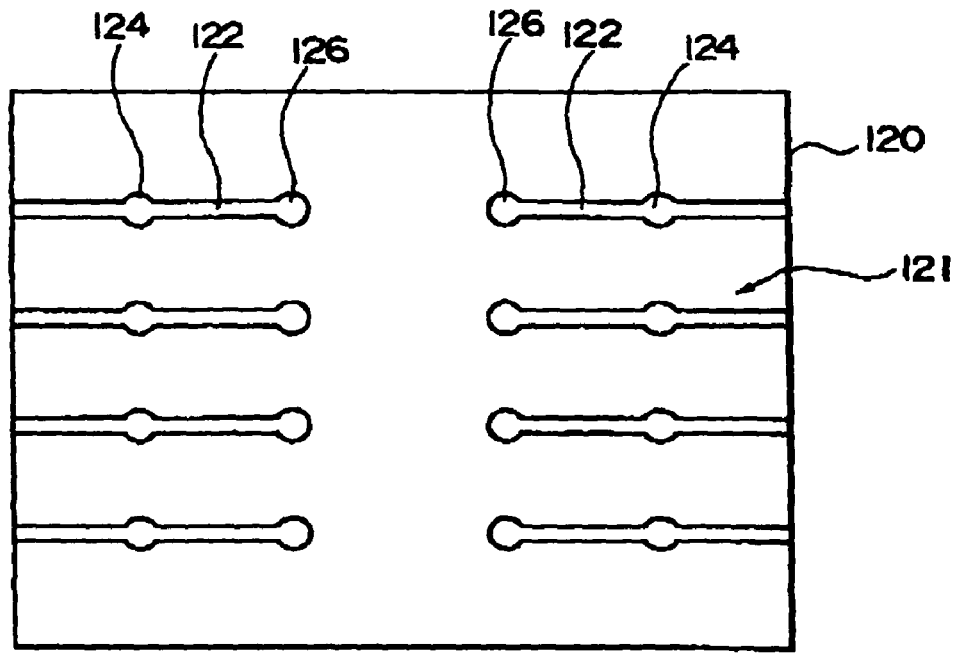
FIGS. 9A and 9B show a substrate of a semiconductor device according to the fourth embodiment of the present invention.
Figure 9B:
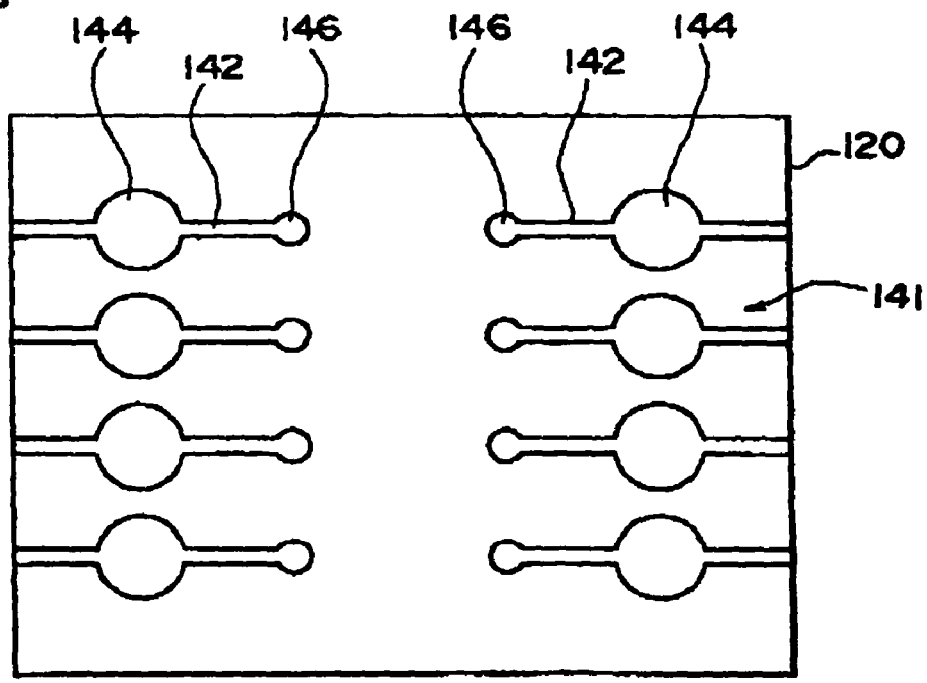

FIG. 9A is one plan view of the substrate of the semiconductor device shown in FIG. 8, and FIG. 9B is the other plan view. On one surface of the substrate 120 is formed a plurality of interconnects (leads) 122, constituting a first interconnect pattern 121. On each of the interconnects 122 are formed lands 124 and 126. The first interconnect pattern 121 may be the same as the interconnect pattern 21 described in the first embodiment. The land 126 shown in FIG. 9A has only to provide electrical conduction between the two sides of the substrate 120, and since no external terminals are provided, may be formed smaller than the land 26 in FIG. 1.

On the other surface of the substrate 120 is formed a plurality of interconnects (leads) 142, constituting a second interconnect pattern 141. On each of the interconnects 142 are formed lands 144 and 146. The second interconnect pattern 141 may be the same as the interconnect pattern 21 described in the first embodiment. In FIG. 9B the land 144 is formed larger, to provide for external terminals. The other land 146 has only to provide electrical conduction between the two sides of the substrate 120, and since no external terminals are provided, may be formed smaller than the land 144.

Over the plurality of through holes 128 formed on the substrate 120 pass a number of the interconnects 122 and 142 formed on each of the surfaces. The ends of the interconnects 122 and 142 may be positioned over the through holes 128. When the lands 126 and 146 are formed at the ends of the interconnects 122 and 142, the lands 126 and 146 are positioned over the through holes 128. The through holes 128 are provided with a conductive material 148, and the interconnects 122 on one surface of the substrate 120 and the interconnects 142 on the other surface are electrically connected.

It should be noted that holes communicating with the through holes 128 may be formed in a part of the interconnects 122 and 148 on both sides of the substrate 120, for example in the lands 126 and 146, and by plating or the like applied to the inner walls of these holes and the through holes 128 to provide a conductive material, the interconnects 122 and 148 on both sides of the substrate 120 may be made electrically conductive.

As shown in enlargement in FIG. 8, on the interconnects 122 formed on one surface of the substrate 120 is formed a first plating layer 130, and on the interconnects 142 formed on the other surface of the substrate 120 is formed a second plating layer 132. The first and second plating layers 130 and 132 have different properties, by virtue of differing in at least either of thickness or material. The first plating layer 130 has the same properties as the first plating layer 30 described in the first embodiment, and the second plating layer 132 has the same properties as the second plating layer 32 described in the first embodiment. That is to say, the first plating layer 130 has good adhesion properties with resin, and the second plating layer 132 has appropriate adhesion properties with the conductive material.

The semiconductor chip 10 is mounted on the substrate 120 by face-down bonding. The bumps 14 of the semiconductor chip 10 and the interconnects 122 formed on one surface of the substrate 120 are electrically connected. Since the first plating layer 130 is formed on the interconnects 122, a satisfactory electrical connection is obtained. When the lands 124 and 126 are formed on the interconnects 122, the one set of lands 124 and the bumps 14 are electrically connected. As the means of electrical connection may be used the anisotropic conductive material 34 comprising conductive particles included in an adhesive formed of a resin. In this case, the conductive particles are interposed between the interconnects 122 and the bumps 14 and provide the electrical connection. The anisotropic conductive material 34 may be an anisotropic conductive film or an anisotropic conductive adhesive.

When the anisotropic conductive material 34 is used, portions of the interconnects 122 which are not in contact with the substrate 120 are covered by the anisotropic conductive material 34. When the anisotropic conductive material 34 is not used, the portions of the interconnects 122 which are not in contact with the substrate 120 are covered by a resin such as an underfill material. The material covering the interconnects 122 may cover the whole of one surface of the substrate 120. The first plating layer 130 formed on the interconnects 122 has good adhesion properties with resin, and therefore the resin provided over the interconnects 122 does not become detached easily.

On the interconnects 142 formed on the other side of the substrate 120 is provided a conductive material 136. In more detail, the conductive material 136 is formed on the second plating layer 132. The conductive material 136 constitutes external terminals. Since the second plating layer 132 has appropriate adhesion properties with the conductive material, a satisfactory electrical connection between the conductive material 136 and the second plating layer 132 is obtained. The conductive material 136 is commonly solder balls, but may equally comprise conductive projections such as plating, conductive resin, or the like.

At this time, other than the locations of formation of external terminals on the second plating layer 132 side may be covered by resist. In this way, for example when forming external terminals of solder, the solder does not wet and spread to other than the locations of forming the external terminals, and at least one of the height and positional accuracy of the external terminals can be maintained by the solder.

In FIG. 8, on both sides of the substrate 120, the first and second interconnect patterns 121 and 141 are formed, and by forming the first and second plating layers 130 and 132, the mounting substrate is obtained. As a method of manufacturing this mounting substrate the method shown in FIG. 4 can be applied. That is to say, one surface of the substrate 120 faces the first anode 50, and the other surface of the substrate 120 faces the second anode 52, and the method described in the first embodiment is applied, whereby the first and second plating layers 130 and 132 of different properties can be formed.

Alternatively, as a method of manufacturing this mounting substrate, the method shown in FIG. 6 can be applied. That is to say, one surface of the substrate 120 faces the first anode 68, and the other surface of the substrate 120 faces the second anode 70, and the method described in the second embodiment is applied, whereby the first and second plating layers 130 and 132 of different properties can be formed.

Alternatively, as a method of manufacturing this mounting substrate, the method shown in FIGS. 7A and 7B can be applied. That is to say, the first interconnect pattern 121 formed on one surface of the substrate 120 may be covered by a first resist and electroless plating carried out, then this resist removed, and the second interconnect pattern 141 formed on the other surface of the substrate 120 covered by a second resist and electroless plating carried out. In this case, the method described in the third embodiment is applied.

Figure 10:
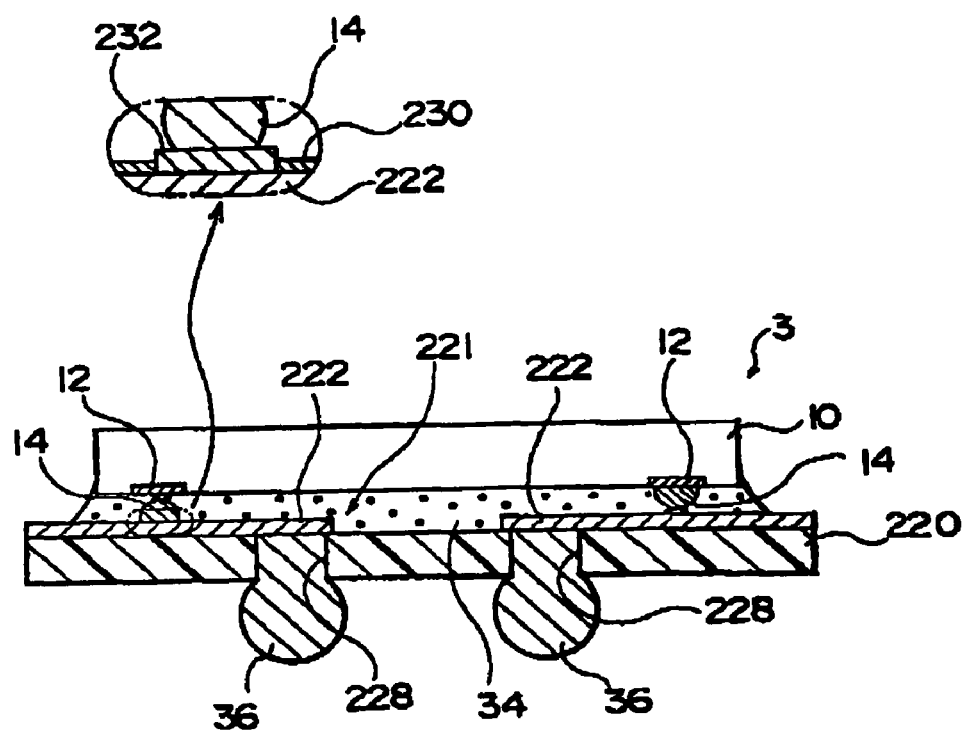
FIG. 10 shows a semiconductor device according to a fifth embodiment of the present invention.

FIG. 10 shows a fifth embodiment of the semiconductor device of the present invention. A semiconductor device 3 comprises a semiconductor chip 10 and a substrate 220. The semiconductor chip 10 is that described in the first embodiment, and has electrodes 12 and bumps 14. In the substrate 220 is formed a plurality of through holes 228, and in form, thickness, and substance these are the same as the substrate 20. On the substrate 220 is formed a plurality of interconnects 22 constituting an interconnect pattern 221. The interconnect pattern 221 and interconnects 222 may have the same construction as the interconnect pattern 21 and interconnects 22 described in the first embodiment. The interconnects 222 pass over the through holes 228.

In this embodiment, as shown in enlargement in FIG. 10, first and second plating layers 230 and 232 are formed on the side of the interconnect pattern 222 opposite to the substrate 220. For other parts of the construction the same construction as is shown in the first embodiment can be applied, and parts of the same construction are also indicated by the same reference numerals in FIG. 10. Although not shown in FIG. 10, on exposed portions within the through holes 228 in the interconnects 222, to provide the conductive material 36 to form the external terminals, a plating layer having the same properties as the first plating layer 32 shown in FIG. 1 may be formed.

The first plating layer 230 has good adhesion properties with resin, and may have the same construction as the first plating layer 30 described in the first embodiment. The second plating layer 232 has appropriate adhesion properties with the conductive material, and may have the same construction as the second plating layer 32 described in the first embodiment.

The first plating layer 230 is formed in the portion (first portion) of the interconnect pattern 221 (interconnects 222) contacted by the resin, and is such as to render the resin provided thereon less liable to becoming detached. The adhesive of the anisotropic conductive material 34 is an example of the resin. The second plating layer 232 is formed in the portion (second portion) of the interconnect pattern 221 (interconnects 222) bonded to the bumps 14 as the conductive material, and provides a reliable electrical connection with the semiconductor chip 10.

On the substrate 220 shown in FIG. 10, the interconnect pattern 221 is formed, and the first and second plating layers 230 and 232 are formed, to obtain the mounting substrate.

Figure 11A:
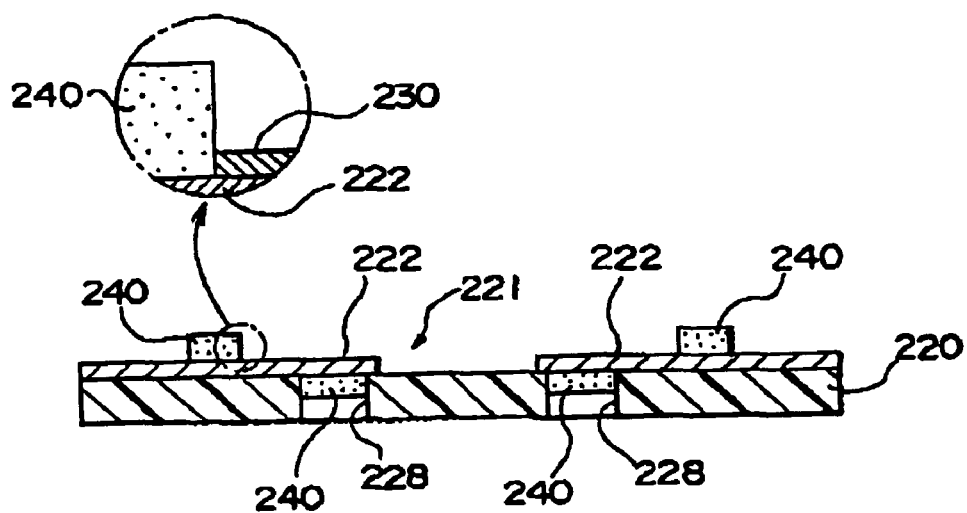
FIGS. 11A and 11B show a method of manufacturing a mounting substrate according to the fifth embodiment of the present invention.
Figure 11B:
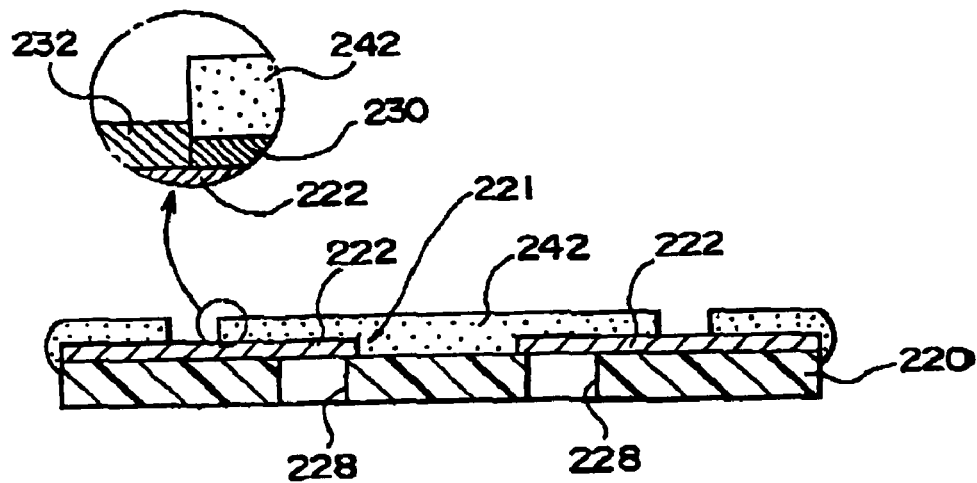

FIGS. 11A and 11B show a method of manufacturing the fifth embodiment of the mounting substrate of the present invention. In this embodiment, the substrate 220 is provided when the interconnect pattern 221 (interconnects 222) shown in FIG. 10 has been formed, and before the first and second plating layers 230 and 232 have been formed.

First, as shown in FIG. 11A, the portion (first portion) of the interconnect pattern 221 (interconnects 222) contacted by the resin is exposed, and on the interconnect pattern 221 (interconnects 222) a resist 240 is formed. The resist 240 is formed to exclude the portion (second portion) bonding with the conductive material. It should be noted that within the through holes 228 may also be filled with the resist 240. The resist 240 may be a resin, or may be a removable tape. Then when electroless plating is carried out, the exposed surface of the interconnects 222 is plated. For example, the first plating layer 230 is formed on the surface of the interconnects 222 opposite to the substrate 20, in the portion (first portion) contacted by the resin.

Next, the resist 240 is removed, and as shown in FIG. 11B, the portion (first portion) of the interconnects 222 contacted by the resin is covered with a resist 242. The resist 242 may be a resin, or may be a removable tape. Within the through holes 228, a part of the interconnects 222 may be exposed. The first plating layer 230 is covered by the resist 242. When electroless plating is carried out, the exposed surface of the interconnects 222 is plated. On the portion (second portion) of the interconnects 222 bonding with the bumps 14 the second plating layer 232 is formed. The same plating layer may be formed on the exposed portion of the interconnects 222 within the through holes 228.

Plating can be carried out on the whole surface of the interconnect pattern 221, and after the portions other than those required, for example other than the second portion and within the through holes 228 have been covered with a resist, if further plating is carried out, plating of the necessary thickness and type can be applied to the necessary portions only.

By means of the above process, the first and second plating layers 230 and 232 are formed on the interconnects 222, and the substrate 220 is obtained, and this constitutes the mounting substrate. In this embodiment, the order of forming the first and second plating layers 230 and 232 is not significant. In the electroless plating step of forming the first and second plating layers 230 and 232, there is no restriction to the use of the same material for the solution, and different materials may be used for the solution. In this case the first and second plating layers 230 and 232 are formed of different materials. Further, both the material and thickness of the first and second plating layers 230 and 232 may be made different.

Figure 12:
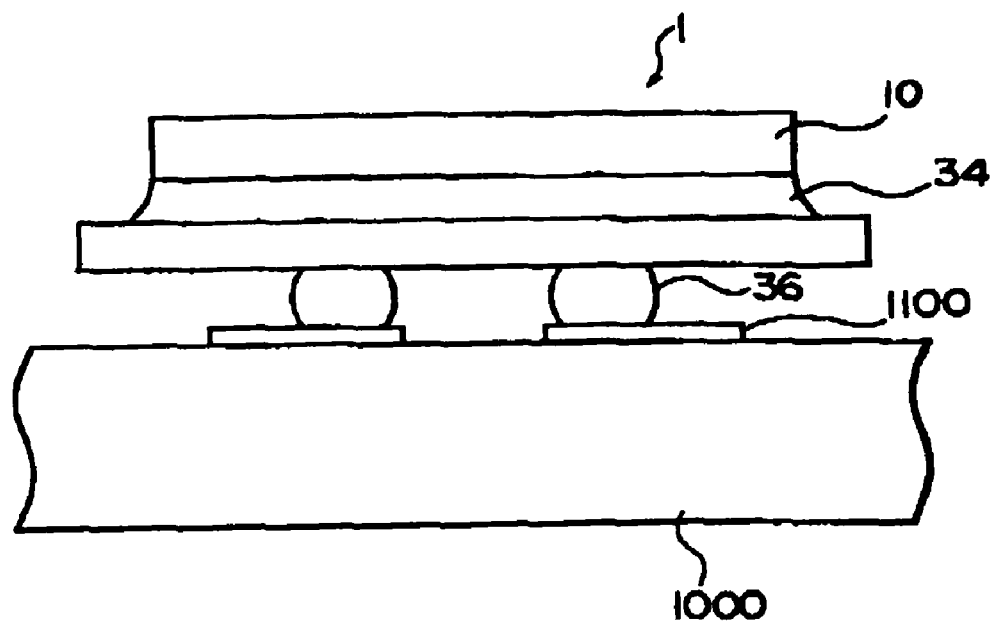
FIG. 12 shows a circuit board to which the present invention is applied.

In FIG. 12 is shown a circuit board 1000 on which is mounted this embodiment of the semiconductor device 1. For the circuit board 1000 is generally used an organic substrate such as a glass epoxy substrate or the like. On the circuit board 1000, an interconnect pattern 1100 of for example copper is formed to constitute a desired circuit, then by mechanical connection of this interconnect pattern and the external terminals 36 of the semiconductor device 1, electrical connection is achieved.

Figure 13:
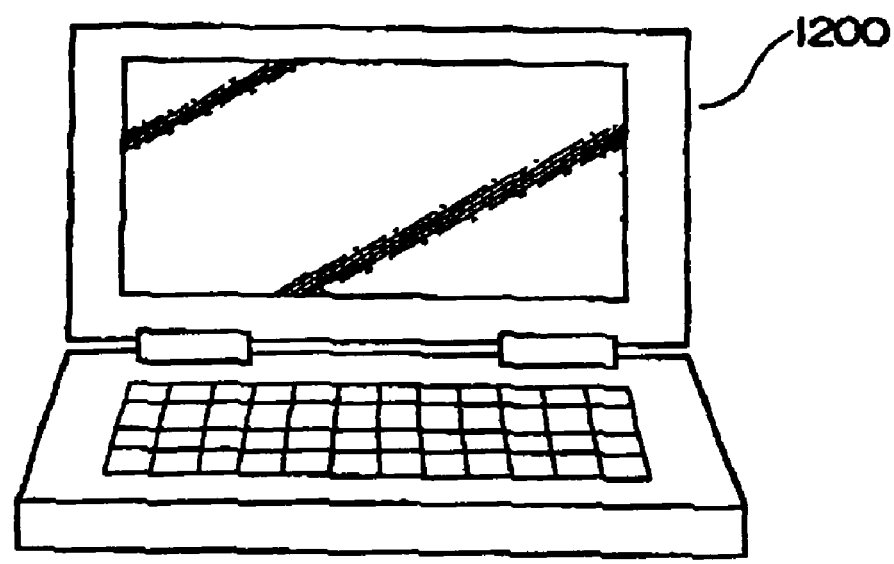
FIG. 13 shows an electronic instrument equipped with a semiconductor device fabricated with application of the method of the present invention.

Then as an electronic instrument 1200 equipped with the semiconductor device 1 to which the present invention is applied, in FIG. 13 is shown a notebook personal computer 1100.

It should be noted that the above-described "semiconductor element" that is structural component of the present invention may be replaced by "electronic element," and an electronic element (either an active element or a passive element) can be mounted on a substrate to fabricate an electronic component, in the same way as a semiconductor chip. As electronic components manufactured by using such an electronic element may be cited, for example, resistors, capacitors, coils, oscillators, filters, temperature sensors, thermistors, varistors, variable resistors, and fuses.

What is claimed is:

1. A method of manufacturing a semiconductor device, the method comprising:
    forming a through hole in a substrate and an interconnect pattern on the substrate, a first portion of the interconnect pattern passing over the through hole;
    forming a first plating layer by covering a first surface of the first portion of the interconnect pattern with a first resist and by applying electroless plating to the interconnect pattern so that the first plating layer is formed on a second surface of the interconnect pattern, the first surface being on the side of the substrate, and the second surface being opposite to the first surface;
    forming a second plating layer by exposing the first surface of the first portion of the interconnect pattern, and by covering the second surface of the interconnect pattern with a second resist, and by applying electroless plating to the interconnect pattern so that the second plating layer is formed on the first surface of the first portion of the interconnect pattern;
    mounting a semiconductor chip on the substrate with a resin positioned between the semiconductor chip and the substrate, the resin being positioned on the first plating layer; and
    providing a conductive material on the second plating layer,
    wherein the first plating layer is positioned between the interconnect pattern and the resin, and the second plating layer is thicker than the first plating layer.

2. The method of manufacturing the semiconductor device as defined in claim 1,
    wherein the first and second plating layers are formed of different materials.

3. A method of manufacturing a mounting substrate comprising the steps of:
    forming a first interconnect pattern on a first surface of a substrate;
    forming a second interconnect pattern electrically connected to the first interconnect pattern on a second surface of the substrate opposite to the first surface of the substrate;
    forming a first plating layer by covering the second interconnect pattern with a first resist and by applying electroless plating to the first interconnect pattern;
    forming a second plating layer by covering the first interconnect pattern with a second resist and by applying electroless plating to the second interconnect pattern;
    mounting a semiconductor chip on the substrate with a resin positioned between the semiconductor chip and the substrate, the resin being positioned on the first plating layer; and
    providing a conductive material on the second plating layer,
    wherein the first plating layer is positioned between the first interconnect pattern and the resin, and the second plating layer is thicker than the first plating layer.

4. The method of manufacturing the semiconductor device as defined in claim 3,
    wherein the first and second plating layers are formed of different materials.

5. A method of manufacturing a semiconductor device, the method comprising:
    forming an interconnect pattern on a substrate;
    forming a first plating layer on a first surface of a first portion of the interconnect pattern opposite to the substrate by covering a first surface of a second portion of the interconnect pattern opposite to the substrate with a first resist and exposing the first surface of the first portion of the interconnect pattern, and by applying electroless plating to the interconnect pattern; and
    forming a second plating layer on the first surface of the second portion of the interconnect pattern by covering the first surface of the first portion of the interconnect pattern with a second resist and exposing the first surface of the second portion of the interconnect pattern, and by applying electroless plating to the interconnect pattern, the second plating layer being in contact with the first plating layer; and
    mounting a semiconductor chip on the substrate with a resin positioned between the semiconductor chip and the substrate, the resin being positioned on the first plating layer, and with a conductive material electrically connecting the semiconductor chip to the interconnect pattern and being positioned on the second plating layer,
    wherein the first plating layer is positioned between the first portion of the interconnect pattern and the resin, and the second plating layer is thicker than the first plating layer.

6. The method of manufacturing the semiconductor device as defined in claim 5,
    wherein the first and second plating layers are formed of different materials.

* * * * *